United States Patent [19]

Aneshansley

[11] 4,224,686

[45] Sep. 23, 1980

[54] ELECTRICALLY ALTERABLE MEMORY CELL

[75] Inventor: Nicholas E. Aneshansley, Centerville, Ohio

[73] Assignee: NCR Corporation, Dayton, Ohio

[21] Appl. No.: 947,927

[22] Filed: Oct. 2, 1978

Related U.S. Application Data

[63] Continuation of Ser. No. 812,863, Jul. 5, 1977, abandoned, which is a continuation of Ser. No. 610,813, Sep. 5, 1975, abandoned.

[51] Int. Cl.$^2$ .................... G11C 11/40; G11C 17/00
[52] U.S. Cl. .................... 365/154; 307/279; 307/238; 365/95; 365/184
[58] Field of Search .............. 365/95, 154, 182, 184, 365/228; 307/238, 279, DIG. 4

[56] References Cited

U.S. PATENT DOCUMENTS

| | | | |
|---|---|---|---|
| 3,651,492 | 3/1972 | Lockwood | 365/154 |
| 3,662,351 | 5/1972 | Ho et al. | 365/95 |
| 3,676,717 | 7/1972 | Lockwood | 365/154 |
| 3,691,537 | 9/1972 | Burgess et al. | 365/154 |

*Primary Examiner*—Stuart N. Hecker
*Attorney, Agent, or Firm*—J. T. Cavender

[57] ABSTRACT

An electrically alterable memory cell is described which has a capacitive imbalance for causing the memory cell to assume either of its two stable states, and which uses a capacitor as a non-volatile storage element for retaining the information stored in the memory cell during power down operation. The capacitor has an alterable capacitance-voltage curve which is employed to identify the information in the bistable multivibrator just prior to loss of power. When power is returned, the capacitor causes the bistable multivibrator to assume that stable state in which it was operating at the time power was lost.

9 Claims, 4 Drawing Figures

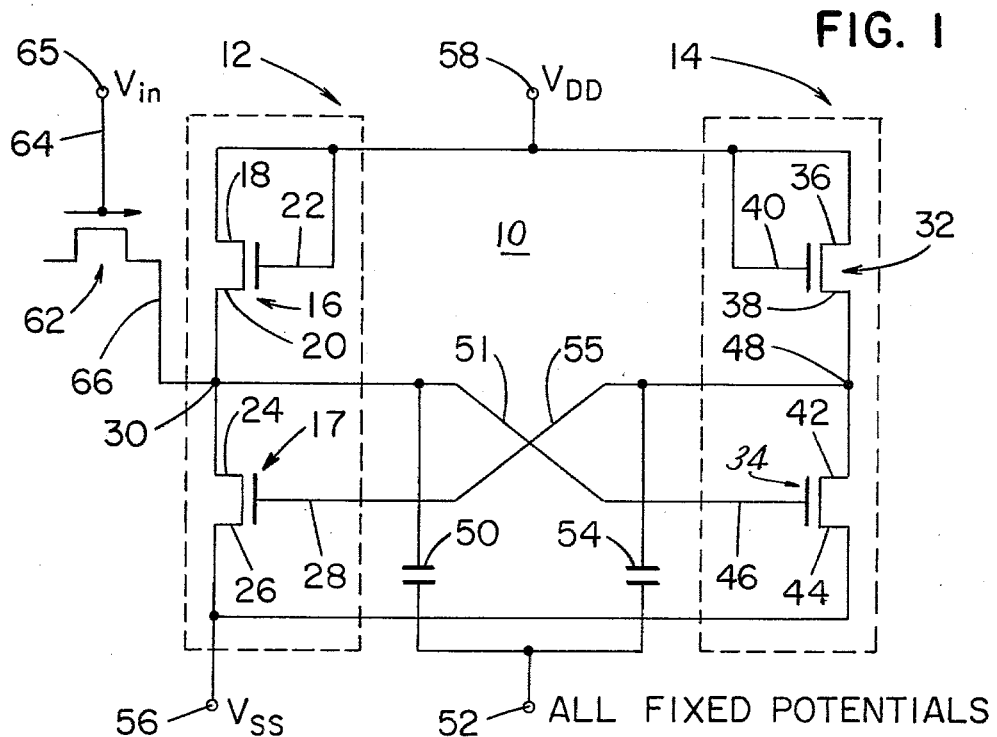

ELECTRICALLY ALTERABLE MEMORY CELL

This is a continuation of application Ser. No. 812,863, filed July 5, 1977, now abandoned, which is a continuation of application Ser. No. 610,813, filed Sept. 5, 1975, now abandoned.

BACKGROUND OF THE INVENTION

This invention relates to memory cell circuits, and more particularly, to an electrically alterable memory cell circuit using a capacitor as a non-volatile storage element for the information stored in the memory cell during power down conditions.

The prior art shows many bistable multivibrator circuit designs using many different types of active elements. This prior art shows MOS bistable multivibrator circuits designed to include a capacitive imbalance in each half of the bistable multivibrator circuit wherein the capacitive imbalance takes the form of a larger transistor junction in one side of the bistable multivibrator as compared to the size of the junction in the other side of the bistable multivibrator. In this prior art circuit, when the bistable multivibrator is activated, both sides of the bistable multivibrator start conducting and a race begins to determine which capacitive means charges the fastest. The side having the smaller capacitance charges more quickly toward the charging voltage level. The voltage being established on the capacitor is cross-coupled to the gate electrode of the transistor in the other side of the bistable multivibrator. When the charging voltage exceeds the turn-on threshold of the transistor, the transistor turns on and ends the race between the two capacitors. The bistable multivibrator is now in one of its two stable states having the side with the larger value of capacitance turned on and the other side turned off.

Since the capacitive elements used in this prior art circuit are the transistor junctions, they are non-alterable. This is to be compared with the present invention which uses variable capacitors in the bistable multivibrator circuit for creating the capacitive imbalance to the bistable multivibrator circuit.

The prior art memory cells using MOS devices do not provide a non-volatile storage function which is performed on the chip itself. In one embodiment of the present invention, the non-volatile storage function is performed by the same capacitive element which also provides the capacitive imbalance to the MOS bistable multivibrator memory cell.

A further embodiment of the present invention employs standard MOS capacitors for providing the capacitive imbalance to the MOS bistable multivibrator circuit in combination with an additional MNOS variable capacitor attached in parallel with one of the standard capacitors for providing the non-volatile storage function to the memory cell.

SUMMARY OF THE INVENTION

It is an object of the present invention to provide a new memory cell circuit compatible with MOS processing techniques.

A still further object of the present invention is to provide a memory cell bistable multivibrator circuit using capacitors of different values for selectively providing a circuit imbalance to the memory cell.

A still further object of the present invention is to provide variable capacitors in each side of a memory cell bistable multivibrator for providing a capacitive imbalance to the bistable multivibrator to insure that the multivibrator turns on to a predetermined state, and for providing a non-volatile memory function during power down of the memory cell circuit.

Another object of the present invention is to provide an improved MOS memory cell circuit for storing information in binary form, which employs capacitors in each half of a memory cell bistable multivibrator for creating a capacitive imbalance to insure that the bistable multivibrator turns on to a predetermined stable state upon the initial energizing of the bistable multivibrator, and which employs a variable capacitor connected in parallel with one of the capacitors for storing, in a non-volatile manner during power down conditions, the information stored in the memory cell, and for returning this information back to the memory cell after power is restored.

These and other objects, features, characteristics, and advantages will be apparent by consideration of the following description of the preferred embodiment of the invention, as illustrated by the accompanying drawings.

BRIEF DESCRIPTION OF THE DRAWINGS

FIG. 1 is a schematic diagram of an embodiment of the improved memory cell;

FIG. 2 is a schematic diagram of another embodiment of the improved memory cell;

BRIEF DESCRIPTION OF THE INVENTION

Figure 3:
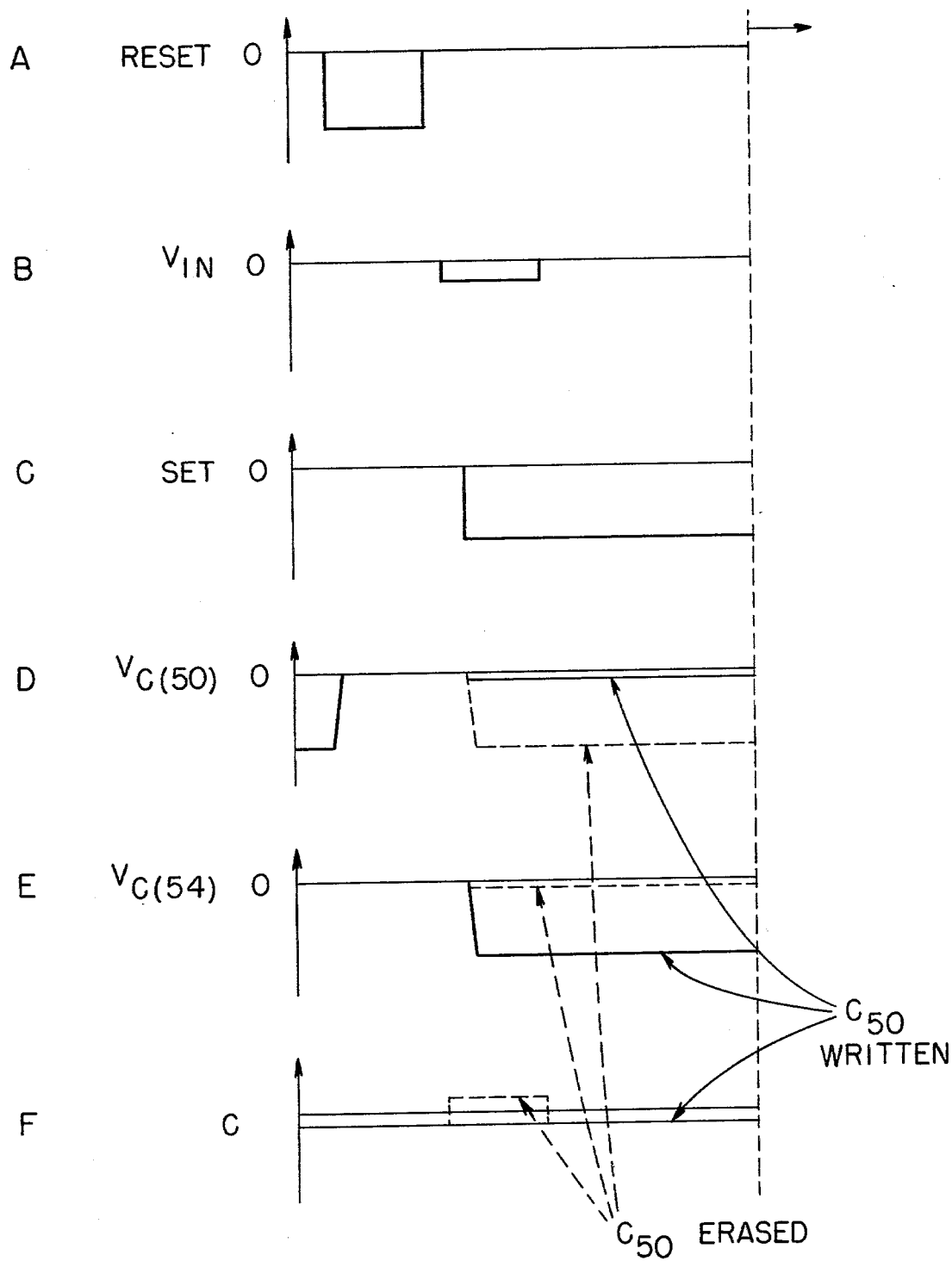
FIG. 3, including A-F, shows a plurality of time-voltage characteristic graphs associated with the circuit shown in FIG. 2.

The present invention is directed to an improved bistable multivibrator memory cell. This memory comprises a bistable multivibrator circuit having capacitive means in each half of the multivibrator. The capacitance of each of the capacitive means is different to give the bistable multivibrator a built-in operating imbalance. Such an imbalance causes one-half of the multivibrator to turn-on in preference to the other half of the multivibrator. This causes the bistable multivibrator to turn-on in a first of its two stable states.

In the preferred embodiment, fixed MOS capacitors of different sizes are used, and a MNOS variable capacitor is connected in parallel with the smaller of the two capacitors. The sum of the larger capacitance stored in the MNOS capacitor, and its fixed companion is greater than the capacitance in the other fixed capacitor. This reverses the natural imbalance of the bistable multivibrator and allows the MOS multivibrator to change its turn-on preference to a second of its stable states under the control of the MNOS capacitor.

DETAILED DESCRIPTION OF THE INVENTION

The same numbers are used to identify the same element shown in the several views.

Referring to FIG. 1, there can be seen a schematic diagram of the improved electrically alterable memory cell. The memory cell is indicated generally at 10 and comprises first and second inverters 12 and 14, respectively. Each inverter comprises half of the memory cell bistable multivibrator. The inverter stage 12 is the left half or first half of the bistable multivibrator memory cell 10. The inverter 12 includes a load transistor 16 and a switching transistor 17. The load transistor has source, drain, and gate electrodes 20, 18 and 22, respectively. The switching transistor 17 has source, drain and gate terminals 26, 24, and 28, respectively. The source electrode 20 of the load transistor 16 is connected to the drain electrode 24 of the switching transistor 17, at a first junction 30.

The inverter stage 14 is the second half of the memory cell. The inverter stage 14 includes a load transistor 32 and a switching transistor 34. The load transistor 32 has drain, source and gate electrodes 36, 38 and 40, respectively. The switching transistor 34 has drain, source and gate electrodes 42, 44 and 46 respectively. The drain electrode 42 of the switching transistor 34 is connected to the source electrode 38 of the load transistor 32, at a second junction 48.

A first capacitive element 50 is connected to the first junction 30. The first junction 30 is connected to the gate electrode 46 of the switching transistor 34 by a first cross-coupling means 51. The other side of the capacitor 50 is connected to a terminal 52. The terminal 52 is connected to a source of fixed potential within the system and this potential is typically at the value of $V_{SS}$.

A second capacitor 54 is connected to the second junction 48. The second junction 48 is cross-coupled to the gate electrode 28 of the switching transistor 17 by a second cross-coupling means 55. The other side of the capacitor 54 is also connected to the fixed potential terminal 52. It will be readily apparent to persons of skill in this art that capacitors 50 and 54 may be separate MIS capacitor structures, combinations of separate MIS capacitor structures and residual capacitances between lead lines, diffusions and/or transistor gate structures and an integrated circuit substrate, or the residual capacitances themselves tailored in value to the purposes of this invention (see e.g. U.S. Pat. No. 3,662,351 where residual capacitances are employed).

The source electrode 26 of the switching transistor 17 and the source electrode 44 of the switching transistor 34 are both connected to the $V_{SS}$ power supply terminal 56. This power supply terminal is typically at the voltage potential of zero volts. The drain electrode 18 of the load transistor 16 and the drain electrode 36 of the load transistor 32 are both connected to the $V_{DD}$ voltage terminal 58 which is typically at $-24$ volts in this embodiment. The gate electrode 22 of the load transistor 16 and the gate electrode 40 of the load transistor 32 are both connected to a terminal 58 and the transistors 16 and 32 are enabled at all times. In a second embodiment as shown in FIG. 2, the gate electrodes 22 and 40 are connected to a SET terminal 60. An enabling signal is required at terminal 60 before transistors 60 and 32 can conduct. The absence of the enabling circuit prevents transistors 16 and 32 from conducting.

The $V_{DD}$ voltage level is typically at $-24$ volts, and the SET signal at the terminal 60 is at the same voltage level as the $V_{DD}$ level or at $-24$ volts.

When an enabling signal is applied to the gates 22 and 40, the load transistors 16 and 32 begin to conduct. Current flows from the $V_{SS}$ voltage level through the respective switching transistors towards the $V_{DD}$ voltage level and charges the capacitors 50 and 54. The increasing charge on the capacitors raises the voltage level at the nodes 30 and 48, respectively. The voltage level on the nodes 30 and 48 begin a race towards a threshold voltage level which is sufficient to turn on the switching transistor in the opposite side of the memory cell. More specifically, the voltage established at node 48 is racing to turn on the transistor 17 by exceeding its threshold level at the gate electrode 28. Conversely, the voltage level at the node 30 is racing to turn on transistor 34 by exceeding the threshold voltage at the gate electrode 46.

The smaller capacitor charges faster and its node reaches the threshold value of the switching transistor in the opposite side of the memory bistable multivibrator faster, causing that transistor to be turned on and permitting the node having the higher voltage level to continue to be charged towards the $V_{DD}$ voltage level.

The capacitors 50 and 54 are standard MOS capacitors, and one is made larger than the other. In this preferred embodiment, illustrated in FIG. 1, the capacitor 54 has a value of 0.7 picofarad and the capacitor 50 has a value of 0.5 picofarad. In this form of the invention, a MNOS variable capacitor 62 has a value of 0.4 picofarad.

Referring again to FIG. 1, the variable MNOS capacitor 62 is shown having a $V_{IN}$ in line 64 and an output line 66. The output line 66 is connected to the junction 30. In the preferred embodiment, the output line 66 is a diffusion which connects the diffusion forming the drain 24 of the transistor 17 to the source 20 of the transistor 16. More specifically, the line 66 is a diffusion made into the surface of the substrate body during the manufacture of the circuit. Obviously, a metal layer can be used to form the line 66.

The variable capacitor suitable for use as the MNOS variable capacitor 62 is completely described in my co-pending patent application filed on Sept. 5, 1975, Ser. No. 610,606 (now abandoned), and entitled "A Capacitor Structure", and assigned to the assignee of the present invention.

The smaller capacitor 50 is charged at a faster rate and the node 30 charges more quickly towards the $V_{DD}$ level. Transistor 34 is turned on and the node 48 drops to the $V_{SS}$ level while node 30 continues to charge to the $V_{DD}$ level. The circuit shown in FIG. 1 is given this permanent imbalance for insuring that the MOS memory cell is turned on and assumes a first stable state in which the junction 30 is at the $V_{DD}$ level and the transistor 17 is off, and the junction 48 is at the $V_{SS}$ level and transistor 34 is turned on.

The bistable multivibrator illustrated in FIG. 1 is shown having a minimum of external control signals. Generally, FIG. 1 shows only the basic bistable multivibrator memory cell which has a permanent capacitive imbalance established by the use of a pair of MOS capacitors of different values. Such a bistable multivibrator circuit has many uses when combined into standard memory arrays using various SET, RESET, SELECT AND SENSE lines. However, at this point in the description of the invention, an improved memory cell is being described. Accordingly, capacitors of different sizes can be used to provide the permanent imbalance to the bistable multivibrator circuit.

Figure 4:
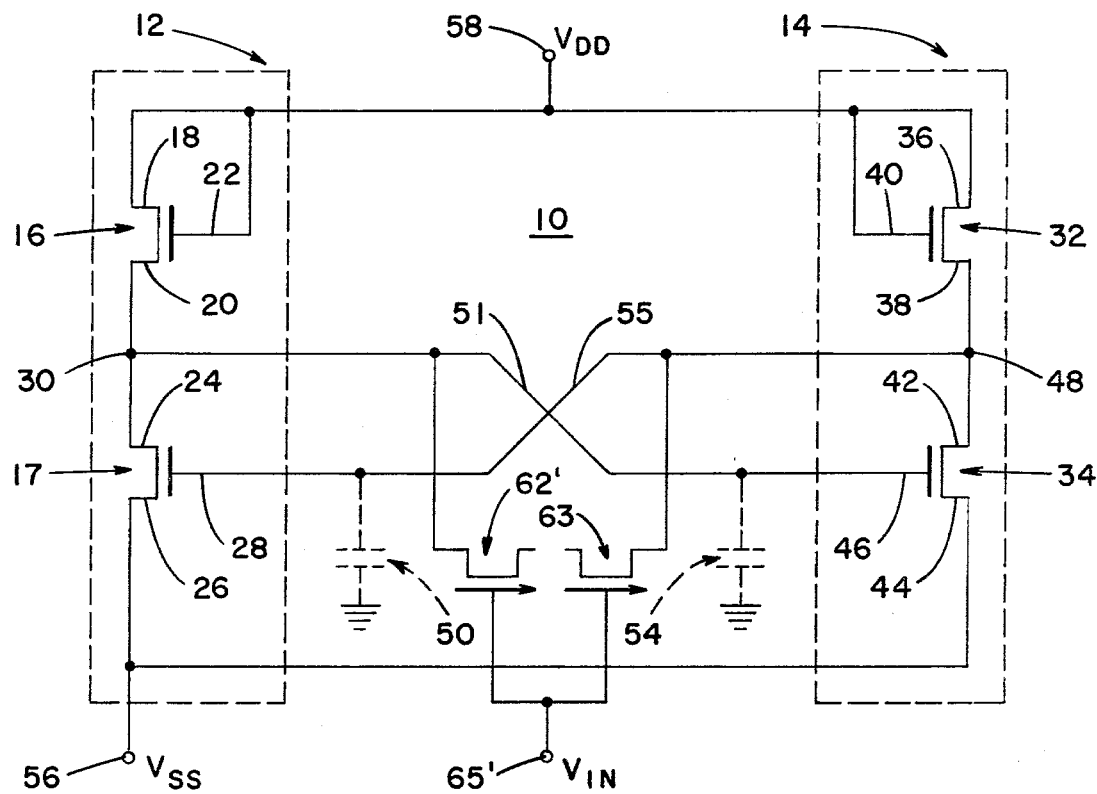
FIG. 4 is a schematic diagram of another embodiment of an improved memory cell.

A second embodiment of the bistable multivibrator is shown in FIG. 4 and is similar to that shown in FIG. 1 but employs alterable capacitors 62' and 63. The capacitors 50 and 54 are then residual capacitances of metal lead lines, transistor gate structures and diffusions which are substantially balanced in value. The alterable capacitors 62', 63' are settable to either of two stable states by the application of write and erase voltage signals to $V_{in}$ terminal 65'. Alterable capacitor structures suitable for application in the present environment are completely described in my aforestated co-pending application Serial No. 610,606 (now abandoned).

When using an alterable capacitor, the capacitive imbalance is changed by applying write and erase signals to the alterable capacitors and switching them to their respective stable states.

In a third embodiment, one of the capacitors, such as 54, can take the form of a standard MOS capacitor while the other of the capacitors, such as 50, can be an alterable MNOS capacitor capable of assuming either of two capacitive values. In this form of the invention, the fixed capacitor 54 is given a value greater than the lower of the two values associated with the MNOS capacitor, while the larger of the capacitive values of the variable MNOS capacitor can be greater than the fixed capacitor 54. Accordingly, when the MNOS capacitor is in its stable state such that the smaller of the two capacitive values is attached to node 30, the lefthand side 12 of the bistable multivibrator charges to the $V_{DD}$ level while the righthand side 14 is turned on and the $V_{SS}$ voltage level is at node 48. When the MNOS capacitor 54 is switched to its higher capacitive value and the circuit is reset, the bistable multivibrator assumes that stable state where the righthand side 14 is off and the $V_{DD}$ level is at node 48. The lefthand side 12 is turned on with the $V_{SS}$ voltage level at node 30. In this mode of operation, the capacitor 50 can be switched by an external signal or by the voltage taken from node 30 during a power down operation.

In the embodiment illustrated in FIG. 1, the capacitors 50 and 54 are MOS capacitors and have fixed values, and the variable MNOS capacitor 62 is operationally attached in parallel with the capacitor 50.

Referring to FIG. 2 there can be seen the bistable multivibrator circuit of FIG. 1 connected into a system environment and using the fourth preferred embodiment. Only the differences in the schematic hook-up between FIGS. 1 and 2 are described rather than redescribe the entire circuit. The gate electrodes 22 and 40 of transistors 16 and 32 are connected to a terminal 60 which is identified as the SET terminal. Reset transistors 70 and 72 are connected into sides 12 and 14, respectively, of the flip-flop 10. The reset transistor 70 employs gate, drain and source terminals 74, 76 and 78, respectively. The drain terminal is connected to the node 30 and the source terminal 78 is connected to the $V_{SS}$ level by way of the terminal 56.

The reset transistor 72 employs gate, drain and source terminals 80, 82 and 84, respectively. The drain terminal 82 is connected to the node 48. The source electrode 84 is connected to the $V_{SS}$ level by way of terminal 56. The gate electrode 80 of the transistor 72 and the gate electrode 74 of the transistor 70 are connected together and both are connected to a terminal 86 identified as the RESET terminal.

In a systems environment, the bistable multivibrator of the present invention is further associated with circuitry used to connect an individual bistable multivibrator 10 into an array containing a plurality of such bistable multivibrators. In order to effectively control an individual bistable multivibrator in such an array, additional sense and drive transistors 90 and 92 are provided. The sense and drive transistor 90 employs gate, drain and source terminals 93, 94 and 96, respectively. The drain electrode 94 is connected to the node 30. The source electrode 96 is connected to a first BIT SENSE line 98, and the gate electrode 93 is connected to a MEMORY SENSE line 100.

The sense and drive transistor 92 employs gate, source and drain terminals 102, 104 and 106, respectively. The source electrode 104 is connected to the node 48, and the drain electrode is connected to a second BIT SENSE line 108. The gate electrode 102 is connected to the MEMORY SENSE line 100.

The bistable multivibrator shown in FIG. 2 can be energized in at least one of three ways. The first mode of operation is identified as the systems mode of operation and employs the sense-drive transistors 90 and 92. These transistors 90 and 92 are controlled by signals applied to the MEMORY SELECT line 100, the first BIT SENSE line 98 and the second BIT SENSE line 108. The MEMORY SELECT line 100 carries an enabling signal for allowing transistors 90 and 92 to conduct. With an application of a $V_{DD}$ signal to the line 98 and an application of a $V_{SS}$ signal to the line 108, node 48 is grounded and node 30 is put at the $V_{DD}$ level. Assuming that the bistable multivibrator is in an otherwise energized state, the bistable multivibrator 10 assumes its first stable state at the removal of the selection signals wherein its left side 12 is off and a $V_{DD}$ signal level at the node 30, and the right side 14 is on with a $V_{SS}$ signal at node 48. In this mode of operation, transistors 90 and 92 are operating in the drive form of operation.

The BIT SENSE lines 98 and 108 can also be used to apply a $V_{DD}$ signal on line 108 and a $V_{SS}$ signal on line 98 for grounding node 30 and putting $V_{DD}$ at node 48. Assuming that the bistable multivibrator is in an otherwise energized state, the bistable multivibrator 10 assumes its second stable state at the removal of the signals on lines 98 and 108. In the second stable state the first section 12 is on and a $V_{SS}$ voltage level is at node 30, and the second section 14 is off and a $V_{DD}$ voltage level is at node 48.

The transistors 90 and 92 are operating in the sense mode of operation when an enabling signal is applied to the MEMORY SELECT line 100 for energizing transistors 90 and 92. In this mode of operation, transistor 90 is conducting because of the $V_{SS}$ level at its source electrode 94, while the transistor 92 is not conducting because of the $V_{DD}$ signal level at its source electrode 104. The current flow travels down the sense line 98, indicating that the lefthand side 12 of the bistable multivibrator is in the high condition. Circuitry (not shown but attached to sense lines 98 and 108) sense the stage of the bistable multivibrator.

In a second form of operation, the bistable multivibrator shown in FIG. 2 is energized by applying a ground signal to the BIT SENSE line 98 and the BIT SENSE line 108 with the MEMORY SENSE line 100 carrying an enabling signal. Both sides of the bistable multivibrator are grounded and both sides of the bistable multivibrator begin to conduct. When the memory sense line is disabled, the side of the bistable multivibrator having the smaller capacitance charges faster and turns on the switching transistor in the opposite side of the bistable multivibrator.

In a third form of operation, the sense and drive transistors 90 and 92 are not used. The bistable multivibrator is reset by the application of a RESET signal to the terminal 86. In this mode of operation, the RESET signal turns on transistors 70 and 72 causing the ground voltage level $V_{SS}$ to be at nodes 30 and 48. When the reset signal at terminal 86 is removed, the bistable multivibrator begins a race to turn on one or the other of its two sides. Again the side having the smaller capacitor charges quicker to the $V_{DD}$ signal level and turns on the transistor in the opposite side of the bistable multivibrator.

In review, the first mode of operation uses the BIT SENSE lines to switch the bistable multivibrator into either of its stable states. The second and third modes of operation reset both sides of the bistable multivibrator to the on condition and let the capacitive imbalance switch the bistable multivibrator to its corresponding stable state. The second mode of operation uses the sense and drive transistors 90 and 92 to reset the bistable multivibrator. The third mode of operation uses the reset transistors 70 and 72 to reset the bistable multivibrator.

The preferred form of the invention illustrated in FIG. 2 employs two fixed MOS capacitors of different sizes, and the MNOS capacitor 62 as a non-volatile memory for storing the information of the bistable multivibrator during periods of power loss. The capacitor 50 is the smaller of the two fixed capacitors. The bistable multivibrator can be driven to either one of its two stable states through the use of the MEMORY SELECT signal and BIT SENSE signals as previously described. For completeness, it is assumed that the bistable multivibrator is driven by the systems control lines which include an enabling signal applied to the memory select line 100 for applying an enabling signal both to the gate electrode 93 of the transistor 90 and to the gate electrode 102 of the transistor 92.

The bit sense line 98 is at the $V_{SS}$ ground level and the bit sense line 108 is at the $V_{DD}$ negative level. These signals cause node 30 to be at ground and node 48 to be at the $V_{DD}$ level. The memory cell is thus driven by the memory control lines to switch to its second stable state.

In its normal mode of operation, power supplies are designed to generate signals indicating a power failure is imminent. These signals precede the actual power loss by very small fractions of a second. During the period just preceding a complete loss of power, the power supply has enough power to apply the following sequence of signals for driving the MNOS capacitor 62 into either one of its two stable states for preserving the status of the bistable multivibrator 10 during the period of loss of power.

With the bistable multivibrator set as previously described, the power supply recognizes an imminent power failure and applies a large positive voltage to the $V_{IN}$ terminal 64, switching the MNOS capacitor 62 to its erase state. In the erased state, the MNOS capacitor has a threshold lying within the range of $-2$ to $-3$ volts. Next, the power supply applies a large negative voltage to the $V_{IN}$ terminal 65. Since node 30 is at the $V_{SS}$ level or ground level, as previously described, a large potential exists across the MNOS capacitor and the MNOS capacitor is driven to its written stable state having a threshold of approximately $-10$ volts. In the MNOS capacitor, as described in my aforestated copending application, the written stable state represents a small value of capacitance. At this point in time, the power to the memory fails. The MNOS capacitor 62 stores information showing that, just before power failed, the node 30 was at the $V_{SS}$ level.

After the power failure has terminated and the system is coming back on line, it is necessary to transfer the information stored in the non-volatile MNOS capacitor 62 into the bistable multivibrator 10 in such a way that the bistable multivibrator 10 assumes a condition indicating its state just prior to power failure. Briefly, the mechanism for achieving this is to add the value of capacitance representing the written stable state of the MNOS capacitor 62 in parallel with the capacitor 50 in such a way that the bistable multivibrator assumes the same stable state that it was in just prior to power failure.

This sequence of steps is shown in graphs A through F of FIG. 3. First, a RESET signal, as shown in graph A, is applied to the terminal 86 for turning on transistors 70 and 72 and applying a $V_{SS}$ signal to nodes 30 and 48. As seen in graph B, the $V_{IN}$ line is kept at ground potential for isolating the MNOS capacitor from node 30 at this point in time. The $V_{IN}$ line is now brought to an intermediate negative voltage level having a value lying between the two threshold voltages of the MNOS capacitor, for example, a $-5$ volt signal level. The set terminal 60 receives, as shown in graph C, its enabling signal for turning on transistors 16 and 32. The intermediate negative voltage level applied to the $V_{IN}$ terminal 65 connects the capacitance value stored in the MNOS capacitor to the node 30. Since the MNOS capacitor is in its written stable state, a small value of capacitance is added to the node 30 such as not to interfere with the normal imbalance built into the bistable multivibrator 10, as shown in graphs D and E. Since the capacitor 50 was originally designed as being the smaller of the two capacitors, the node 30 charges faster towards the $V_{DD}$ level turning on transistor 34 causing $V_{SS}$ to be at node 48 and continuing the charge of the capacitor 50 towards the $V_{DD}$ level and the level is established at node 30. Relative capacitances are illustrated in graph F. The cell refreshes to a state inverted from its original state. Several means can be used to account for the inversion at the chip level. They are: refreshing, writing and refreshing the cell again on power up, thus inverting twice or having a reference cell which changes state each time the array is written and refreshed and using this reference cell to invert or not invert data going in and out of the memory.

In a second mode of operation, the bit sense lines 98 and 108 set the capacitor into the state wherein node 30 is at the $V_{DD}$ level, which is approximately $-24$ volts, and the node 48 is at $V_{SS}$ level, which is ground potential. Again, when the power supply senses an imminent power breakdown, a relatively high positive signal is applied to the $V_{IN}$ terminal 65 of the MNOS capacitor 62 switching the capacitor to its erased stable state having a threshold of minus two $(-2)$ to minus three $(-3)$. Immediately thereafter, a relatively negative voltage signal is applied to the $V_{IN}$ terminal 65 having a value of approximately $-24$ volts. Since the node 30 is at a $-24$ volts, and the $V_{IN}$ terminal is at a $-24$ volts, the capacitor 62 does not have a signal across it of sufficient voltage differential to cause it to change its stable state. In this second mode of operation the MNOS capacitor 62 remains in its erased stable state which has associated with it a relatively high value of capacitance.

After the power is returned, the bistable multivibrator goes through a sequence of steps to re-establish the memory cell to a condition indicating its state just prior to the loss of power. The enabling signal on the set terminal 60 is off, a RESET signal is applied to terminal 86 causing nodes 30 and 48 to go to the ground level. An intermediate signal is applied to the $V_{IN}$ terminal 65 for connecting the capacitance value of the MNOS capacitor 62 to node 30. The enabling signal at the set terminal 60 becomes available for turning on transistors 16 and 32. The bistable multivibrator is engaged in its standard race condition for charging nodes 30 and 48. Since the value of capacitance added to the node 30 by the MNOS capacitor 62 is substantially large, the total capacity of that contributed by the MNOS capacitor 62, plus the capacitor 50, is greater than the value of capacitance in capacitor 54, (FIG. 3, graphs D, E and F dashed lines). Since capacitor 54 is now smaller than the combined capacitance of the MNOS capacitor 62 and capacitor 50, node 48 charges faster than node 30. A negative signal is reached at node 48 so as to turn on transistor 17 prior to a voltage achieved at node 30 to turn on transistor 34. Since transistor 17 turns on in this mode of operation, a $V_{SS}$ level is applied to node 30 while node 48 continues to charge towards the $V_{DD}$ level. In this manner, the value of capacitance stored on the MNOS capacitor 62 just prior to power failure is used to counteract the natural imbalance built into the bistable multivibrator 10 and cause the bistable multivibrator 10 to achieve a stable state under the control of the value of capacitance stored on the MNOS capacitor.

It will be apparent to persons of skill in this art that the embodiment of this invention shown in FIG. 4 could readily be employed in the system environment of FIG. 2 to achieve an identical result. The only difference in operation is that the two alterable capacitors 62', 63 would be placed in different threshold states during the power down storage sequence, and the resulting differential capacitance values thereof would produce the imbalance causing the device to assume a reverse bistable state after the power up data recovery or refresh operations are preformed.

While the invention has been described using several preferred embodiments, it will be understood by those skilled in the art that variations may be made without departing from the spirit and scope of the invention.

What is claimed is:

1. A bistable multivibrator of the type having a first and a second stable state, and a first and a second section, wherein the bistable multivibrator is in its first stable state when the first section is turned off and the second section is turned on, and the bistable multivibrator is in its second stable state when the first section is turned on and the second section is turned off, said bistable multivibrator comprising:

a first bistable multivibrator section comprising a load impedance means and a switching transistor connected together at a first junction;

a second bistable multivibrator section comprising a load impedance means and a switching transistor connected at a second junction;

first means for cross-coupling said first junction to said switching transistor of said first section;

second means for cross-coupling said second junction to said switching transistor of said first section;

first capacitive means connected to said first junction; and second capacitive means connected to said second junction;

at least one of said first and second capacitive means including a non-volatile, threshold-alterable capacitor having a gate terminal independent of the associated junction and adapted to receive selectable write, refresh, erase and disable voltage signals whereby said non-volatile threshold alterable capacitor may be selectively employed to store and refresh binary information in said multivibrator, said non-volatile capacitor having in response to said refresh signal a capacitance of a first lower value in a written threshold state or a second higher value in an erased threshold state.

2. A bistable multivibrator as recited in claim 1 wherein:

each of said first and second capacitive means comprises a non-volatile threshold alterable capacitor.

3. A bistable multivibrator as recited in claim 1, wherein:

said first capacitive means comprises a fixed capacitor of a third value and said non-volatile threshold alterable capacitor connected in parallel to said first junction, and said second capacitive means is a fixed capacitor of a fourth value which is larger than said third value and said first lower value combined and smaller than said third value and said second higher value combined;

said first capacitive means and said second capacitive means giving said bistable multivibrator a first capacitive imbalance for biasing said bistable multivibrator towards assuming said first stable state when said alterable capacitor is in a written state with a refresh voltage on said gate terminal; and said capacitive means and said second capacitive means giving said bistable multivibrator a second capacitance imbalance for biasing said bistable multivibrator towards assuming said second stable state when said alterable capacitor is in an erased state with a refresh voltage on said gate terminal.

4. In a memory system of the type employing a plurality of individual memory cells, wherein each of said cells comprises an individual bistable multivibrator having two stable states, and the system includes means for selectively addressing at least one individual memory cell, and means for writing desired information into said bistable multivibrator in said addressed cell by setting said bistable multivibrator into one of its stable conditions, an improved bistable multivibrator comprising:

a first section having a load impedance means and a switching transistor connected together at a first junction;

a second section having a load impedance means and a switching transistor connected together at a second junction;

first cross-coupling means for connecting said first junction with said switching transistor of the second section;

second cross-coupling means connecting said second junction to said switching transistor of said first section;

first capacitive means having a first value of capacitance, and said first capacitive means being connected to said first junction;

second capacitive means having a second value of capacitance which is larger than said first value of capacitance, and said second capacitive means being connected to said second junction; and third capacitive means having a first non-volatile threshold state and a second non-volatile threshold state, said first state being associated with a third value of capacitance substantially less than the difference between said first and second values, said second state being associated with a fourth value of capacitance substantially larger than the difference between said first and second values, said third capacitive means being connected to said first junction and having a gate terminal independent of said junction and adapted to receive selectable write, refresh, erase and ground voltage signals, whereby said memory system is selectably operable in the following modes:
(1) a static random access memory having a settable non-volatile initial memory state upon being powered-up regardless of its state upon power down; or
(2) a non-volatile random access memory for non-volatile storage of the last memory state prior to power-down.

5. A non-volatile memory device comprising a bistable multivibrator having selectable first and second stable, volatile operation states and including a pair of output terminals having voltages thereon representing the operating state thereof; a pair of non-volatile, threshold-alterable capacitors coupled to said output terminals and having gate electrodes independent of said output terminals adapted to receive write, refresh, erase and disable voltage signals for selectably controlling the writing of operating state information of said multivibrator into said capacitors, refreshing of said multivibrator with said stored operating state information, erasing of said stored operating state information, and functionally disabling said capacitors from interfering with transfer of information to and from said multivibrator.

6. A non-volatile memory device comprising a bistable multivibrator including a pair of cross-coupled, field effect transistors defining a pair of output terminals for storing volatile binary data signals; and a pair of non-volatile, threshold-alterable capacitors each having one terminal coupled to one of said output terminals and another terminal commonly coupled to a control signal terminal and being adapted to respond to a control signal voltage on said control signal terminal to store said volatile binary data in a non-volatile manner in terms of relative different threshold voltage values of said non-volatile capacitors.

7. A non-volatile memory device comprising a bistable circuit including a pair of insulated gate field effect transistors for storing volatile information at a pair of nodes each formed at the junction between the gate of one of said field effect transistors and the drain of the other of said field effect transistors; and a pair of non-volatile, threshold-alterable capacitors each having one terminal coupled to one of said nodes and the other terminal connected commonly to a control signal terminal and being adapted to respond to a control signal applied to said other terminal from said control signal terminal to store said volatile information in a non-volatile manner in terms of relative threshold voltage values of said non-volatile capacitors.

8. A non-volatile memory device comprising a bistable circuit having a pair of cross-coupled field effect transistors defining a pair of output terminals for storing volatile binary data in the form of respective pairs of voltage signals on said output terminals; and a pair of capacitance means each having one terminal coupled to one of said output terminals, at least one of said capacitance means comprising a non-volatile, threshold-alterable capacitor having a gate electrode independent of said output terminals and adapted to respond to a control signal to store said volatile binary data in terms of the threshold voltage value of said non-volatile capacitor.

9. A non-volatile memory device as claimed in claim 8, wherein the other of said capacitence means comprises a non-volatile, threshold alterable capacitor having a gate electrode independent of said output terminals and coupled in common with the gate electrode of the other of said non-volatile capacitors to a control signal terminal, said non-volatile capacitors being adapted to respond to a control signal on said control signal terminal to store said volatile binary data in a non-volatile manner in terms of relative different threshold voltage values of said non-volatile capacitors.

* * * * *